(12) United States Patent
Kajiwara et al.

(10) Patent No.: US 11,757,028 B2
(45) Date of Patent: *Sep. 12, 2023

(54) SEMICONDUCTOR DEVICE AND METHOD FOR MANUFACTURING THE SAME

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Yosuke Kajiwara, Yokohama (JP); Daimotsu Kato, Kawasaki (JP); Masahiko Kuraguchi, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/559,148

(22) Filed: Dec. 22, 2021

(65) Prior Publication Data

US 2022/0115529 A1  Apr. 14, 2022

Related U.S. Application Data

(63) Continuation of application No. 17/232,201, filed on Apr. 16, 2021, which is a continuation of application (Continued)

(30) Foreign Application Priority Data

Jul. 23, 2018 (JP) .................................. 2018-137963

(51) Int. Cl.
*H01L 29/778* (2006.01)
*H01L 21/02* (2006.01)
(Continued)

(52) U.S. Cl.
CPC .... *H01L 29/7787* (2013.01); *H01L 21/02458* (2013.01); *H01L 21/28264* (2013.01);
(Continued)

(58) Field of Classification Search
CPC .......... H01L 29/2004; H01L 21/02554; H01L 29/7787; H01L 29/205; H01L 29/42356;
(Continued)

(56) References Cited

U.S. PATENT DOCUMENTS 8,114,726 B2   2/2012  Marui et al.
8,866,157 B2  10/2014  Nakamura
(Continued)

FOREIGN PATENT DOCUMENTS

JP  2011-077122  4/2011
JP  2011-192719  9/2011
(Continued)

*Primary Examiner* — Alonzo Chambliss
(74) *Attorney, Agent, or Firm* — Oblon, McClelland, Maier & Neustadt, L.L.P.

(57) ABSTRACT

According to one embodiment, a semiconductor device includes first to third electrodes, first and second semiconductor layers, a nitride layer, and an oxide layer. A direction from the second electrode toward the first electrode is aligned with a first direction. A position in the first direction of the third electrode is between the first electrode and the second electrode in the first direction. The first semiconductor layer includes first to fifth partial regions. The first partial region is between the fourth and third partial regions in the first direction. The second partial region is between the third and fifth partial regions in the first direction. The nitride layer includes first and second nitride regions. The second semiconductor layer includes first and second semiconductor regions. The oxide layer includes silicon and oxygen. The oxide layer includes first to third oxide regions.

19 Claims, 10 Drawing Sheets

Related U.S. Application Data

No. 16/292,387, filed on Mar. 5, 2019, now Pat. No. 11,018,248.

(51) Int. Cl.
*H01L 21/28* (2006.01)
*H01L 29/423* (2006.01)
*H01L 29/205* (2006.01)
*H01L 29/20* (2006.01)
*H01L 29/51* (2006.01)
*H01L 29/66* (2006.01)

(52) U.S. Cl.
CPC ........ *H01L 29/2003* (2013.01); *H01L 29/205* (2013.01); *H01L 29/42356* (2013.01); *H01L 29/42368* (2013.01); *H01L 29/42376* (2013.01); *H01L 29/513* (2013.01); *H01L 29/518* (2013.01); *H01L 29/66462* (2013.01); *H01L 21/02241* (2013.01); *H01L 21/02326* (2013.01)

(58) Field of Classification Search
CPC ......... H01L 29/42368; H01L 29/42376; H01L 29/513; H01L 29/518; H01L 29/66462; H01L 21/28264
See application file for complete search history.

(56) References Cited

U.S. PATENT DOCUMENTS

| | | | |
|---|---|---|---|
| 9,306,027 | B2 | 4/2016 | Inoue et al. |
| 9,818,855 | B2 | 11/2017 | Saito |
| 10,256,308 | B1 | 4/2019 | Shimizu |
| 10,535,744 | B2 | 1/2020 | Shimizu |
| 11,018,248 | B2 | 5/2021 | Kajiwara et al. |
| 2014/0197460 | A1 | 7/2014 | Makiyama |
| 2016/0225857 | A1 | 8/2016 | Saito |
| 2017/0077277 | A1 | 3/2017 | Saito |
| 2017/0373168 | A1 | 12/2017 | Ozaki et al. |

FOREIGN PATENT DOCUMENTS

| | | |
|---|---|---|
| JP | 2014-138110 A | 7/2014 |
| JP | 2015-103780 | 6/2015 |
| JP | 2015-213100 A | 11/2015 |
| JP | 2017-228685 A | 12/2017 |

SEMICONDUCTOR DEVICE AND METHOD FOR MANUFACTURING THE SAME

CROSS-REFERENCE TO RELATED APPLICATIONS

The present application is a Continuation of U.S. application Ser. No. 17/232,201, having a filing date of Apr. 16, 2021, which is a Continuation of U.S. application Ser. No. 16/292,387, now U.S. Pat. No. 11,018,248, having a filing date of Mar. 5, 2019 which is based on and claims the benefit of priority from Japanese Patent Application No. 2018-137963, filed on Jul. 23, 2018, the entire contents of which are incorporated herein by reference.

FIELD

Embodiments described herein relate generally to a semiconductor device and a method for manufacturing the same.

BACKGROUND

For example, there is a semiconductor device that uses a nitride semiconductor. It is desirable for the semiconductor device to have stable characteristics.

DETAILED DESCRIPTION

Figure 1:
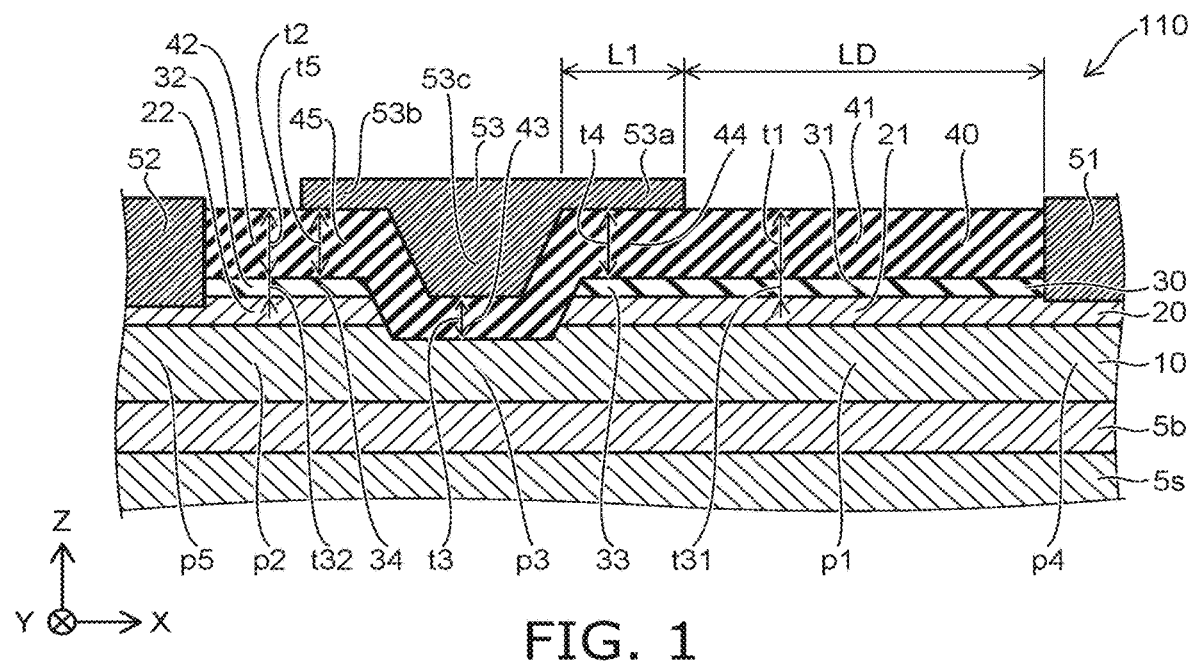
FIG. 1 is a schematic cross-sectional view illustrating a semiconductor device according to a first embodiment.

According to one embodiment, a semiconductor device includes first to third electrodes, a first semiconductor layer, a second semiconductor layer, a nitride layer, and an oxide layer. A direction from the second electrode toward the first electrode is aligned with a first direction. A position in the first direction of the third electrode is between a position in the first direction of the first electrode and a position in the first direction of the second electrode. The first semiconductor layer includes $Al_{x1}Ga_{1-x1}N$ ($0 \leq x1 \leq 1$). The first semiconductor layer includes first to fifth partial regions. A direction from the fourth partial region toward the first electrode, a direction from the fifth partial region toward the second electrode, and a direction from the third partial region toward the third electrode are aligned with a second direction crossing the first direction. The first partial region is between the fourth partial region and the third partial region in the first direction. The second partial region is between the third partial region and the fifth partial region in the first direction. The nitride layer includes silicon and nitrogen. A ratio Si/N of a concentration of silicon (Si) in the nitride layer to a concentration of nitrogen (N) in the nitride layer is not less than 0.68 and not more than 0.72. The nitride layer includes a first nitride region and a second nitride region. The second semiconductor layer includes $Al_{x2}Ga_{1-x2}N$ ($0 < x2 \leq 1$). The second semiconductor layer includes a first semiconductor region and a second semiconductor region. The first semiconductor region is provided between the first partial region and the first nitride region in the second direction and contacts the first nitride region. The second semiconductor region is provided between the second partial region and the second nitride region in the second direction and contacts the second nitride region. The oxide layer includes silicon and oxygen. A concentration of nitrogen in the oxide layer is lower than a concentration of nitrogen in the nitride layer. The oxide layer includes first to third oxide regions. At least a portion of the first nitride region is provided between the first oxide region and the first semiconductor region. At least a portion of the second nitride region is provided between the second oxide region and the second semiconductor region. The third oxide region is provided between the third partial region and the third electrode and contacts the third partial region and the third electrode.

According to another embodiment, a method for manufacturing a semiconductor device is disclosed. The method can include performing heat treatment of a stacked body. The stacked body includes a first semiconductor layer, a second semiconductor layer, and a nitride layer. The first semiconductor layer includes $Al_{x1}Ga_{1-x1}N$ ($0 \leq x1 \leq 1$). The second semiconductor layer includes $Al_{x2}Ga_{1-x2}N$ ($0 < x2 \leq 1$). The nitride layer includes silicon and nitrogen. The second semiconductor layer is provided between the first semiconductor layer and the nitride layer. A ratio Si/N of a concentration of silicon (Si) in the nitride layer to a concentration of nitrogen (N) in the nitride layer is not less than 0.68 and not more than 0.72. The method can include removing a portion of the nitride layer and a portion of the second semiconductor layer after the heat treatment and forming an oxide layer at a remaining portion of the nitride layer and a remaining portion of the second semiconductor layer. The oxide layer includes silicon and oxygen. A concentration of nitrogen in the oxide layer is lower than a concentration of nitrogen in the nitride layer. In addition, the method can include forming an electrode, the oxide layer being provided between the electrode and the remaining portion of the second semiconductor layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes first to third electrodes 51 to 53, a first semiconductor layer 10, a second semiconductor layer 20, a nitride layer 30, and an oxide layer 40.

The direction from the second electrode 52 toward the first electrode 51 is aligned with a first direction. The first direction is taken as an X-axis direction. One direction perpendicular to the X-axis direction is taken as a Z-axis direction. A direction perpendicular to the X-axis direction and the Z-axis direction is taken as a Y-axis direction.

The position in the first direction (the X-axis direction) of the third electrode 53 is between the position in the first direction of the first electrode 51 and the position in the first direction of the second electrode 52. For example, the third electrode 53 is between the first electrode 51 and the second electrode 52 in the X-axis direction.

The first semiconductor layer 10 includes $Al_{x1}Ga_{1-x1}N$ (0≤x1≤1). The composition ratio x1 may be, for example, not less than 0 and not more than 0.2. The first semiconductor layer 10 is, for example, a GaN layer.

The first semiconductor layer 10 includes first to fifth partial regions p1 to p5. The direction from the fourth partial region p4 toward the first electrode 51 is aligned with the second direction. The second direction crosses the first direction (the X-axis direction). The second direction may be the Z-axis direction.

The direction from the fifth partial region p5 toward the second electrode 52 is aligned with the second direction (e.g., the Z-axis direction) recited above. The direction from the third partial region p3 toward the third electrode 53 is aligned with the second direction (e.g., the Z-axis direction) recited above.

The first partial region p1 is between the fourth partial region p4 and the third partial region p3 in the first direction (the X-axis direction). The second partial region p2 is between the third partial region p3 and the fifth partial region p5 in the first direction (the X-axis direction).

The nitride layer 30 includes silicon and nitrogen. The ratio Si/N of the concentration of silicon (Si) in the nitride layer 30 to the concentration of nitrogen (N) in the nitride layer 30 is not less than 0.68 and not more than 0.72. The nitride layer 30 is a "N-rich layer." The nitride layer 30 includes a first nitride region 31 and a second nitride region 32.

The second semiconductor layer 20 includes $Al_{x2}Ga_{1-x2}N$ (0<x2≤1). The composition ratio x2 is, for example, not less than 0.05 and not more than 0.35. The second semiconductor layer 20 is, for example, an AlGaN layer.

The second semiconductor layer 20 includes a first semiconductor region 21 and a second semiconductor region 22. The first semiconductor region 21 is provided between the first partial region p1 and the first nitride region 31 in the second direction (e.g., the Z-axis direction). The first semiconductor region 21 contacts the first nitride region 31. The second semiconductor region 22 is provided between the second partial region p2 and the second nitride region 32 in the second direction (e.g., the Z-axis direction). The second semiconductor region 22 contacts the second nitride region 32.

The oxide layer 40 includes silicon and oxygen. The concentration of nitrogen in the oxide layer 40 is lower than the concentration of nitrogen in the nitride layer 30. The oxide layer 40 is, for example, a $SiO_2$ layer. The oxide layer 40 includes first to third oxide regions 41 to 43. At least a portion of the first nitride region 31 is provided between the first oxide region 41 and the first semiconductor region 21. At least a portion of the second nitride region 32 is provided between the second oxide region 42 and the second semiconductor region 22. The third oxide region 43 is provided between the third partial region p3 and the third electrode 53.

For example, the at least a portion of the first nitride region 31 recited above contacts the first oxide region 41. For example, the at least a portion of the second nitride region 32 recited above contacts the second oxide region 42. For example, the third oxide region 43 contacts the third partial region p3 and the third electrode 53.

A substrate 5s and a buffer layer 5b are provided in the example. The buffer layer 5b is provided between the substrate 5s and the first semiconductor layer 10. The substrate 5s may be, for example, a sapphire substrate. The substrate 5s may be, for example, a silicon substrate. The buffer layer 5b may include, for example, multiple nitride layers. For example, multiple nitride layers that have different compositions may be stacked in the buffer layer 5b.

For example, the buffer layer 5b is provided on the substrate 5s. The first semiconductor layer 10 is provided on the buffer layer 5b. The second semiconductor layer 20 is provided on the first semiconductor layer 10. The nitride layer 30 is provided on a portion of the second semiconductor layer 20. The third oxide region 43 of the oxide layer 40 is provided on another portion of the second semiconductor layer 20. The third electrode 53 is provided on the third oxide region 43. For example, the first electrode 51 is electrically connected to a portion (the first semiconductor region 21) of the second semiconductor layer 20. For example, the second electrode 52 is electrically connected to another portion (the second semiconductor region 22) of the second semiconductor layer 20.

For example, the first electrode 51 functions as a drain electrode. For example, the second electrode 52 functions as a source electrode. For example, the third electrode 53 functions as a gate electrode. At least a portion (e.g., the third oxide region 43) of the oxide layer 40 functions as a gate insulating film.

For example, the current that flows between the first electrode 51 and the second electrode 52 can be controlled according to the potential of the third electrode 53. The semiconductor device 110 is, for example, a HEMT (high-electron mobility transistor). For example, the semiconductor device 110 may have a normally-off operation.

In the semiconductor device 110 according to the embodiment as described above, the "N-rich" nitride layer 30 is provided as a layer contacting the second semiconductor layer 20. The ratio Si/N of the nitride layer 30 is not less than 0.68 and not more than 0.72. Stable characteristics are obtained thereby. For example, a stable current is obtained. For example, a high breakdown voltage is obtained. Examples of the characteristics of the semiconductor device 110 are described below.

As shown in FIG. 1, at least a portion of the third oxide region 43 may be provided between the first semiconductor region 21 and the second semiconductor region 22 in the first direction (the X-axis direction). For example, a portion of the third oxide region 43 may be between the first partial region p1 and the second partial region p2 in the first direction (the X-axis direction). A high threshold voltage is obtained by such a configuration. For example, a normally-off operation is obtained easily.

In the example, the third electrode 53 includes first to third electrode regions 53a to 53c. The position in the first direction (the X-axis direction) of the third electrode region 53c is between the position in the first direction of the first electrode region 53a and the position in the first direction of the second electrode region 53b.

On the other hand, the oxide layer 40 may include a fourth oxide region 44 and a fifth oxide region 45 in addition to the first to third oxide regions 41 to 43.

The nitride layer 30 may further include a third nitride region 33 and a fourth nitride region 34. The third nitride region 33 is positioned between the first nitride region 31 and the second nitride region 32 in the first direction (the X-axis direction). The fourth nitride region 34 is positioned between the third nitride region 33 and the second nitride region 32 in the first direction (the X-axis direction).

The fourth oxide region 44 is between the third nitride region 33 and the first electrode region 53a in the second direction (e.g., the Z-axis direction). The fifth oxide region 45 is between the fourth nitride region 34 and the second electrode region 53b in the second direction.

The third oxide region 43 is provided between the third partial region p3 and the third electrode region 53c.

The thicknesses along the second direction (the Z-axis direction) of the first to fifth oxide regions 41 to 45 are respectively taken as thicknesses t1 to t5. In one example, the thickness t3 along the second direction of the third oxide region 43 may be thinner than the thickness t4 along the second direction of the fourth oxide region 44. The thickness t3 may be thinner than the thickness t5 along the second direction of the fifth oxide region 45.

For example, the thickness t3 is set to obtain the target threshold voltage. In one example, the thickness t3 is, for example, not less than 25 nm and not more than 35 nm.

On the other hand, the electric field of the fourth oxide region 44 and the fifth oxide region 45 can be reduced by increasing the thickness t4 and the thickness t5. For example, the breakdown voltage can be increased. For example, fluctuation of the characteristics due to a continuous operation for a long period of time or breakdown of the fourth oxide region 44 and the fifth oxide region 45 can be suppressed.

For example, the first thickness t1 and the second thickness t2 each are, for example, not less than 25 nm and not more than 100 nm. The first thickness t1 may be the same as the fourth thickness t4. The second thickness t2 may be the same as the fifth thickness t5. As described below, these thicknesses may be different from each other.

The length along the first direction (the X-axis direction) of the first electrode region 53a is taken as a length L1. If the length L1 is excessively long, the electric field between the first electrode 51 and the first electrode region 53a becomes excessively high. Thereby, for example, there are cases where fluctuation of the characteristics occurs easily. If the length L1 is excessively short, the function of the first electrode region 53a as a field plate becomes small. The fluctuation of the characteristics can be suppressed by appropriately setting the length L1.

In one example, the length L1 is 5 µm or less. The length L1 along the first direction of the first electrode region 53a may be not less than 0.035 times and not more than 0.35 times a length LD along the first direction between the first electrode region 53a and the first electrode 51.

In the embodiment, for example, the thickness of the nitride layer 30 is thinner than the thickness t3 of the third oxide region 43. The thickness along the second direction (e.g., the Z-axis direction) of the first nitride region 31 is taken as a first thickness t31. The thickness along the second direction (e.g., the Z-axis direction) of the second nitride region 32 is taken as a second thickness t32. For example, the first thickness t31 and the second thickness t32 each are thinner than the thickness t3. An example of the relationship between the characteristics and the first thickness t31 and the second thickness t32 is described below.

An example of experimental results relating to the characteristics of the nitride layer 30 will now be described. In the experiment described below, samples that include a MIS (metal-insulator semiconductor) are evaluated. The samples include a silicon substrate, a nitride layer provided on the silicon substrate, and an electrode provided on the nitride layer. The nitride layer includes silicon and nitrogen. A voltage that is positive when referenced to the silicon substrate is applied to the electrode. A current (a leakage current) that flows between the silicon substrate and the electrode is measured.

Figure 2:
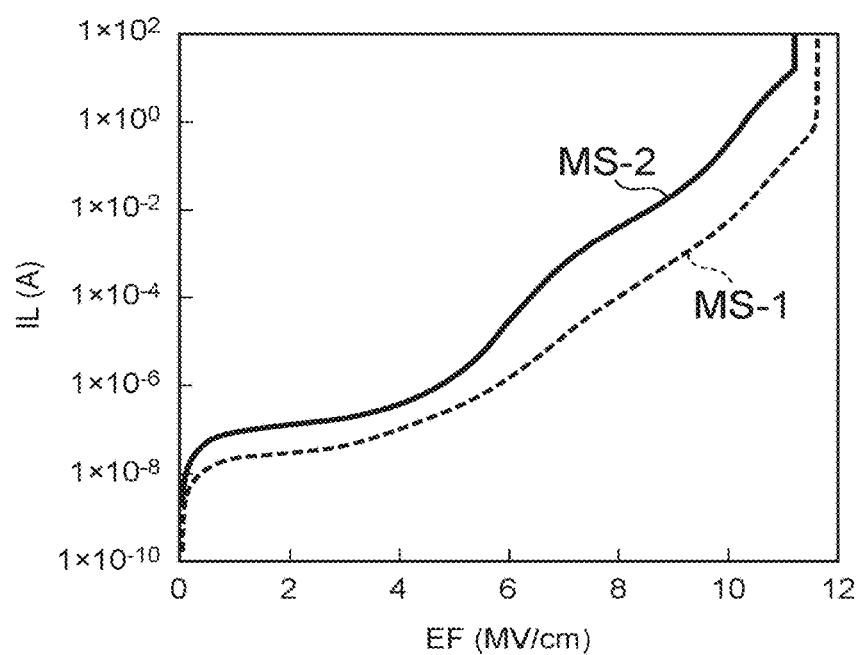
FIG. 2 is a graph illustrating a characteristic of the nitride layer.

FIG. 2 is a graph illustrating a characteristic of the nitride layer.

The horizontal axis of FIG. 2 is an electric field EF (MV/cm). The product of the electric field EF and the thickness of the nitride layer corresponds to the applied voltage. The vertical axis is a leakage current IL (A). The result of a first measurement MS-1 and the result of a second measurement MS-2 are shown in FIG. 2. For the first measurement MS-1, the measurement is performed after making the sample and before performing heat treatment. For the second measurement MS-2, the measurement is performed after making the sample and after performing the heat treatment. The heat treatment is performed in a nitrogen atmosphere for 5 minutes at 700° C.

As shown in FIG. 2, the leakage current IL increases as the electric field EF increases. Compared to the first measurement MS-1 before the heat treatment is performed, the leakage current IL is larger for the second measurement MS-2 measured after the heat treatment is performed.

The results of FIG. 2 are for samples having the MIS structure. For example, in a semiconductor device that uses a nitride semiconductor, fluctuation of the characteristics, breakdown of the device, etc., occur easily when the leakage current IL is large.

Generally, in a semiconductor device that uses a semiconductor such as Si, SiC, etc., a silicon oxide film that is obtained by thermal oxidation of the surface portion of these semiconductors can be used as an insulating film. Conversely, in a semiconductor device that uses a nitride semiconductor including AlGaN, etc., it is difficult to use an oxide film made by thermal oxidation as the insulating film.

Therefore, in a semiconductor device that uses a nitride semiconductor including AlGaN, etc., a film that includes silicon or the like is formed as the insulating film by CVD (chemical vapor deposition), etc. Many impurities are included in films formed by CVD, etc. Therefore, to remove the impurities, heat treatment is performed after the film is formed.

However, as shown in FIG. 2, it was found that the leakage current IL increases when the heat treatment is performed. It is considered that, for example, the quality of the nitride layer changes due to the heat treatment. For example, there is a possibility that the quality of the interface between the nitride layer and the AlGaN layer degrades due to the heat treatment.

There is a possibility that the increase of the leakage current IL is related to the amount of dangling bonds inside the nitride layer. There is a possibility that the amount of dangling bonds inside the nitride layer is related to the ratio of silicon and nitrogen in the nitride layer.

An example of the measurement results of the relationship between the dangling bonds and a composition ratio R1 (Si/N) of the nitride layer will now be described. In the following samples, a nitride layer that includes silicon and nitrogen is formed by CVD on a GaN layer. The composition ratio R1 (Si/N) of the nitride layer is controlled by the flow rate of ammonia when forming the nitride layer.

Figure 3:
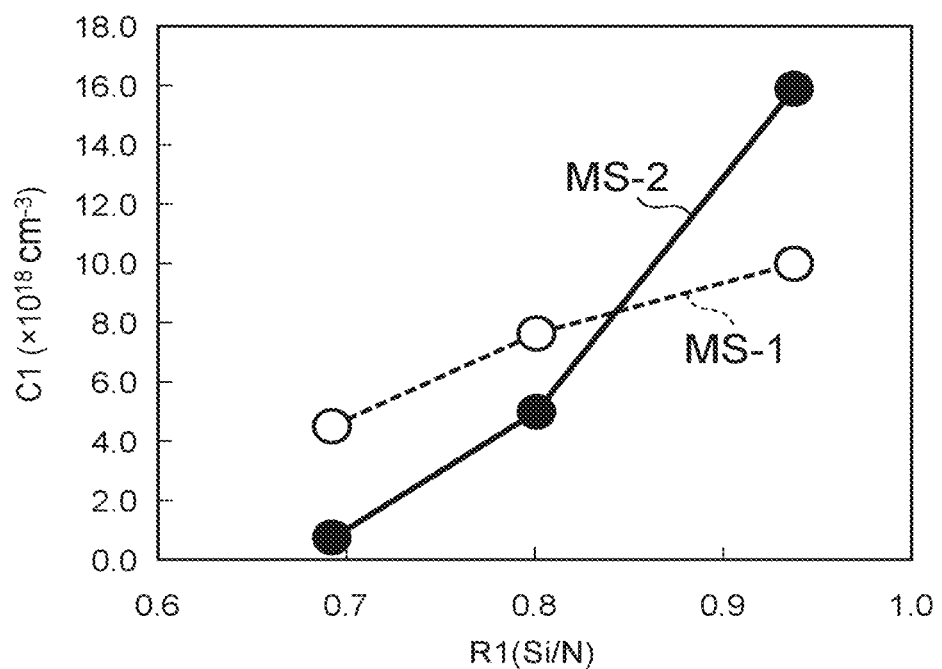
FIG. 3 is a graph illustrating a characteristic of the nitride layer.

FIG. 3 is a graph illustrating a characteristic of the nitride layer.

The horizontal axis of FIG. 3 is the composition ratio R1 (Si/N). The composition ratio R1 (Si/N) is the ratio of the concentration of silicon (Si) in the nitride layer to the concentration of nitrogen (N) in the nitride layer. The stoichiometric composition of silicon nitride is $Si_3N_4$. The composition ratio R1 (Si/N) in the stoichiometric composition of silicon nitride is 0.75. The composition ratio R1 (Si/N) is silicon-rich ("Si-rich") when greater than 0.75. The composition ratio R1 (Si/N) is nitrogen-rich ("N-rich") when less than 0.75. The vertical axis of FIG. 3 is a concentration C1 ($\times 10^{18}$ $cm^{-3}$) of the dangling bonds. The dangling bond concentration C1 is measured by ESR (Electron Spin Resonance).

FIG. 3 illustrates the result of the first measurement MS-1 (the measurement before the heat treatment) and the result of the second measurement MS-2 (the measurement after the heat treatment).

It can be seen from FIG. 3 that the dangling bond concentration C1 is different between the first measurement MS-1 and the second measurement MS-2. When the composition ratio R1 (Si/N) is high (e.g., 0.94), the dangling bond concentration C1 is higher for the second measurement MS-2 (the measurement after the heat treatment) than for the first measurement MS-1 (the measurement before the heat treatment).

Conversely, it was found that when the composition ratio R1 (Si/N) is low (e.g., 0.7), the dangling bond concentration C1 is lower for the second measurement MS-2 (the measurement after the heat treatment) than for the first measurement MS-1 (the measurement before the heat treatment). The dangling bond concentration C1 after the heat treatment is performed can be reduced by reducing the composition ratio R1 (Si/N) to be nitrogen-rich.

Figure 4:
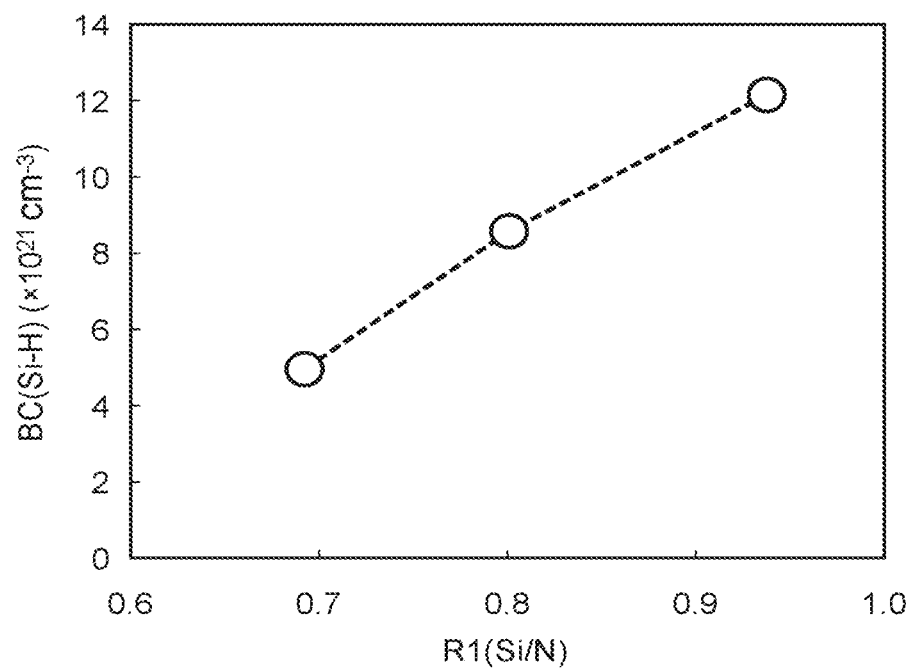
FIG. 4 is a graph illustrating a characteristic of the nitride layer.

FIG. 4 is a graph illustrating a characteristic of the nitride layer.

The horizontal axis of FIG. 4 is the composition ratio R1 (Si/N). The vertical axis of FIG. 4 is a concentration BC (Si—H) ($cm^{-3}$) of the bond (Si—H) of Si and hydrogen in the nitride layer. The concentration BC (Si—H) of the bond of Si and hydrogen is evaluated using FT-IR (Fourier Transform Infrared Spectroscopy). FIG. 4 corresponds to the result before the heat treatment.

As shown in FIG. 4, the concentration BC (Si—H) of the bond of Si and hydrogen decreases as the composition ratio R1 (Si/N) decreases.

For example, many Si—H groups exist inside a "Si-rich" nitride layer. Si—H bonds are broken by the heat treatment; and the hydrogen (H) is consumed. It is considered that many unbonded defects (dangling bonds) are formed in the remaining Si. For example, it is considered that the leakage current increases easily due to the dangling bonds.

For example, it is considered that the desorption of Ga or nitrogen occurs easily at the interface between the nitride layer and the AlGaN layer in the "Si-rich" nitride layer. It is considered that the dangling bonds increase easily at the interface. It is considered that the reliability degrades easily thereby.

The concentration BC (Si—H) of the Si—H groups is lower in the "N-rich" nitride layer. For example, it is considered that the leakage current can be suppressed thereby. In the "N-rich" nitride layer, the consumption of the Ga or the nitrogen at the interface between the nitride layer and the AlGaN layer can be suppressed. For example, the dangling bonds at the interface are suppressed. For example, high reliability is obtained.

An example of measurement results of the relationship between the composition ratio of the nitride layer and the current flowing in the nitride layer will now be described. The samples described below have a MIS structure. In the MIS structure, a nitride layer that includes silicon and nitrogen is formed by CVD on a GaN layer. The composition ratio R1 (Si/N) of the nitride layer is controlled by the flow rate of ammonia when forming the nitride layer. An electrode is provided on the nitride layer. A voltage is applied between the GaN layer and the electrode; and the current that flows at this time is measured. The current is measured for a positive and negative voltage (electric field) with respect to the GaN layer. The characteristics when positive correspond to a forward breakdown voltage test of the semiconductor device. The characteristics when negative correspond to a reverse breakdown voltage test of the semiconductor device.

Figure 5:
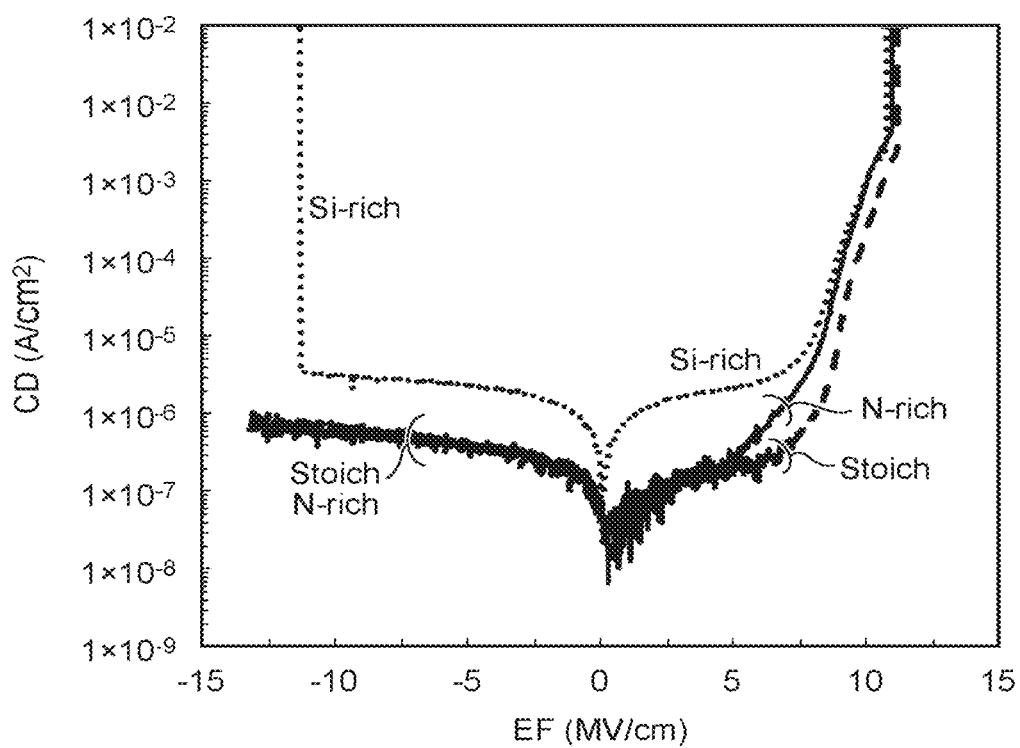
FIG. 5 is a graph illustrating a characteristic of the nitride layer.

FIG. 5 is a graph illustrating a characteristic of the nitride layer.

The horizontal axis of FIG. 5 is the electric field EF (MV/cm). The vertical axis is a current density CD ($A/cm^2$). FIG. 5 shows measurement results relating to a "Si-rich" sample, a "N-rich" sample, and a "Stoich" sample. In the "Si-rich" sample, the composition ratio R1 (Si/N) is 0.94. In the "N-rich" sample, the composition ratio R1 (Si/N) is 0.69. In the "Stoich" sample, the composition ratio R1 (Si/N) is 0.76. The composition ratios are measured by RBS (Rutherford Backscattering Spectrometry).

As shown in FIG. 5, the current density CD is lower for the "N-rich" sample and the "Stoich" sample compared to the "Si-rich" sample.

For the positive electric field EF, the current density CD increases abruptly when the electric field EF is about 10 MV/cm for all of the samples. The abrupt increase of the current density CD corresponds to element breakdown. The resistance to the positive electric field EF is substantially independent of the composition ratio R1 (Si/N).

On the other hand, for the negative electric field EF, an abrupt increase of the current density CD is not observed for the "N-rich" sample and the "Stoich" sample. Conversely, for the "Si-rich" sample, the current density CD increases abruptly when the electric field EF is about −12 MV/cm.

Thus, good voltage tolerance is obtained for the "N-rich" sample and the "Stoich" sample.

As recited above, the dangling bond concentration C1 after the heat treatment is low for the "N-rich" nitride layer (referring to FIG. 3). For example, the concentration BC (Si—H) of the Si—H groups is low for the "N-rich" nitride layer (referring to FIG. 4). Further, good voltage tolerance is obtained is for the "N-rich" nitride layer (referring to FIG. 5). For example, element breakdown is suppressed. For example, a semiconductor device that has stable characteristics can be provided.

A relationship between the composition ratio of the nitride layer and the characteristics of the semiconductor device using the nitride layer will now be described. The semiconductor device has the configuration described in reference to FIG. 1. The composition ratio R1 (Si/N) is modified for the nitride layer 30 described in reference to FIG. 1.

Figure 6:
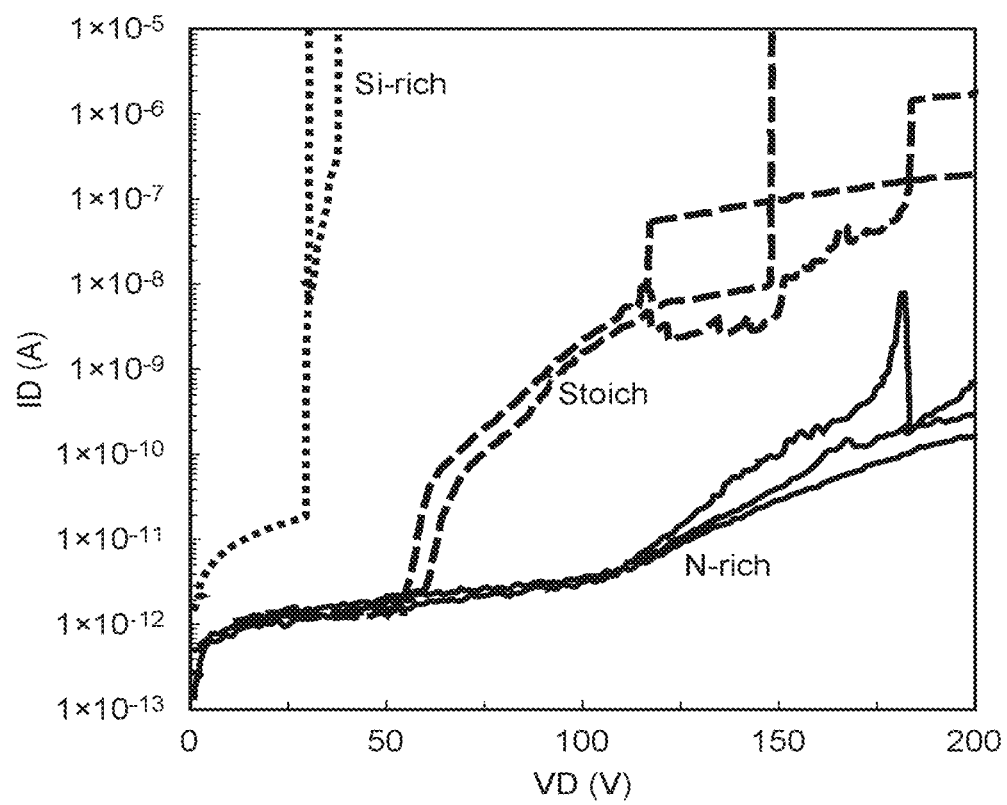
FIG. 6 is a graph illustrating a characteristic of the semiconductor device.

FIG. 6 is a graph illustrating a characteristic of the semiconductor device.

The horizontal axis of FIG. 6 is a drain voltage VD (V). The drain voltage VD corresponds to the voltage applied to the first electrode 51. The vertical axis is a drain current ID (A). FIG. 6 shows measurement results relating to the "Si-rich" sample, the "N-rich" sample, and the "Stoich" sample. In the "Si-rich" sample, the composition ratio R1 (Si/N) is 0.94. In the "N-rich" sample, the composition ratio R1 (Si/N) is 0.69. In the "Stoich" sample, the composition ratio R1 (Si/N) is 0.76. FIG. 6 shows the measurement results after the heat treatment.

As shown in FIG. 6 for the "Si-rich" sample, the drain current ID is large when the drain voltage VD is low. The drain current ID increases abruptly when the drain voltage VD is about 30 V. The abrupt increase corresponds to the breakdown of the semiconductor device.

As shown in FIG. 6 for the "Stoich" sample, the drain current ID becomes large when the drain voltage VD exceeds about 52 V. The drain current ID increases abruptly when the drain voltage VD is about 120 V. The abrupt increase corresponds to the breakdown of the semiconductor device.

Conversely, as shown in FIG. 6 for the "N-rich" sample, the drain current ID is small even when the drain voltage VD increases. Thus, a high breakdown voltage is obtained for the "N-rich" sample.

For example, it is considered that by using a "N-rich" film as the nitride layer 30, the dangling bonds (the defects) inside the nitride layer 30 can be low. It is considered that the leakage current is suppressed thereby. For example, the reverse leakage is suppressed even after the heat treatment. For example, a good device breakdown voltage is obtained even after the heat treatment.

For example, it is considered that the "N-rich" film suppresses the desorption of nitrogen from the second semiconductor layer 20 (e.g., the AlGaN layer). For example, it is considered that interface defects are reduced. It is considered that by reducing the interface defects, for example, the reverse leakage is suppressed. The interface defects are reduced. A good device breakdown voltage is obtained.

An example of current collapse will now be described. For example, in a GaN power device, the on-resistance may increase when voltage stress is continuously applied to the drain electrode. The phenomenon of the on-resistance increasing due to the drain voltage stress is, for example, current collapse.

Figure 7:
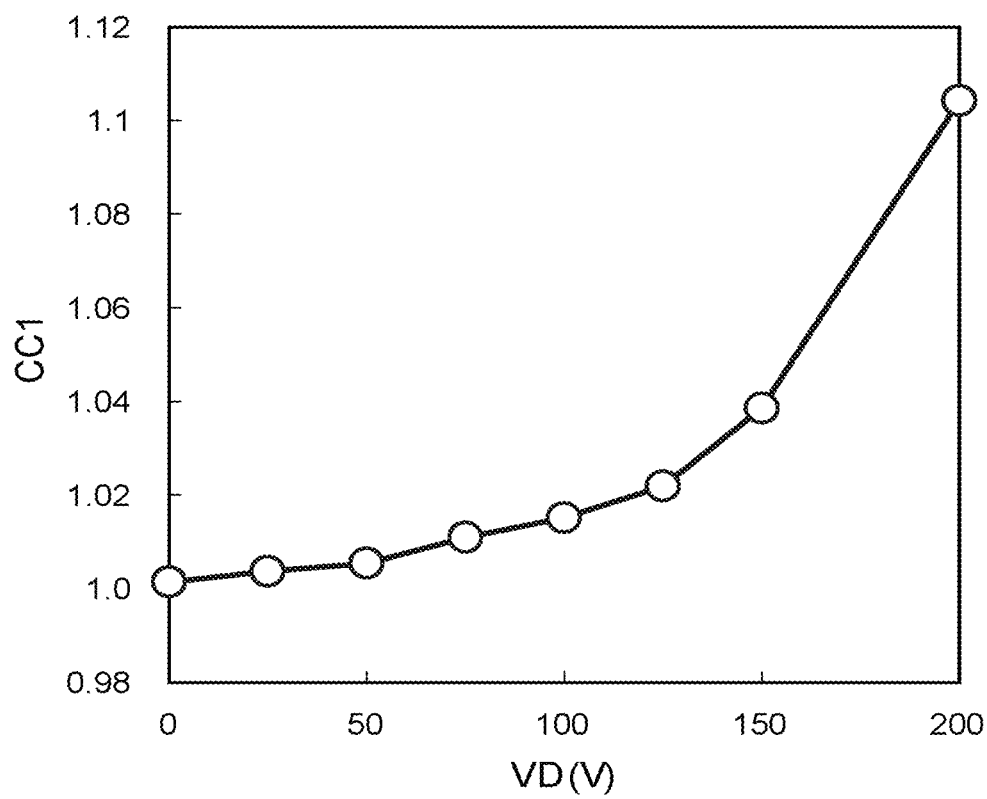
FIG. 7 is a graph illustrating a characteristic of the semiconductor device.

FIG. 7 is a graph illustrating a characteristic of the semiconductor device.

The horizontal axis of FIG. 7 is the drain voltage VD (V) used as the stress. The vertical axis is a resistance increase rate CC1. The resistance increase rate CC1 is the ratio of the resistance when stress is applied to the resistance when stress is not applied (when the drain voltage VD is 0). As shown in FIG. 7, the resistance increase rate CC1 increases as the drain voltage VD which is the stress increases.

The inventor discovered by experiments that the resistance increase rate CC1 changes according to the formation conditions of the nitride layer 30. Measurement results of the resistance increase rate CC1 when changing the flow rate of ammonia which is one source gas when forming the nitride layer 30 will now be described. The samples have the configuration illustrated in FIG. 1.

Figure 8:
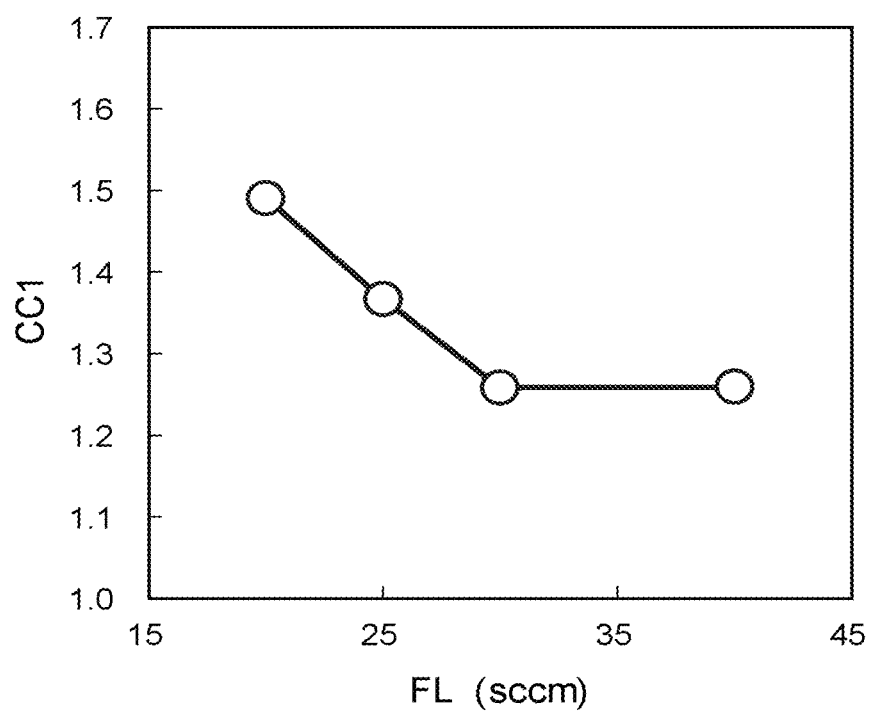
FIG. 8 is a graph illustrating a characteristic of the semiconductor device.

FIG. 8 is a graph illustrating a characteristic of the semiconductor device.

The horizontal axis of FIG. 8 is a flow rate FL (sccm) of ammonia when forming the nitride layer 30. The vertical axis is the resistance increase rate CC1. In the example, the drain voltage VD which is the stress is 175 V. A "N-rich" film is obtained when the flow rate FL of ammonia is large. A "Si-rich" film is obtained when the flow rate FL of ammonia is small. It can be seen from FIG. 8 that it was found that a low resistance increase rate CC1 is obtained for the "N-rich" nitride layer 30 when the flow rate FL of ammonia is large.

Figure 9:
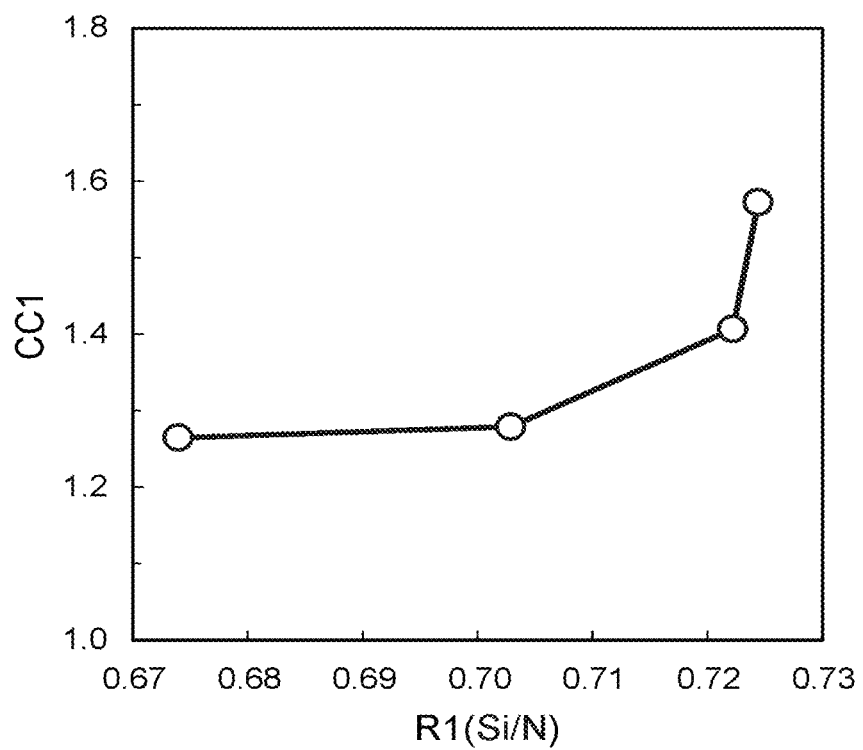
FIG. 9 is a graph illustrating a characteristic of the semiconductor device.

FIG. 9 is a graph illustrating a characteristic of the semiconductor device.

The horizontal axis of FIG. 9 is the composition ratio R1 (Si/N) of the nitride layer 30. The vertical axis is the resistance increase rate CC1. In the example, the drain voltage VD which is the stress is 175 V. The samples have the configuration illustrated in FIG. 1.

It can be seen from FIG. 9 that the resistance increase rate CC1 decreases as the composition ratio R1 (Si/N) of the nitride layer 30 decreases. The decrease of the resistance increase rate CC1 is pronounced when the composition ratio R1 (Si/N) is 0.722 or less.

In the embodiment, it is favorable for the composition ratio R1 (Si/N) of the nitride layer 30 to be 0.722 or less. It is more favorable for the composition ratio R1 (Si/N) to be 0.72 or less. It is more favorable for the composition ratio R1 (Si/N) to be 0.702 or less. A low resistance increase rate CC1 is obtained.

It is considered that the interface state between the second semiconductor layer 20 (the AlGaN layer) and the nitride layer 30 is reduced by setting the composition ratio R1 (Si/N) of the nitride layer 30 to be less than 0.75 (e.g., 0.722 or less, etc.). It is considered that the resistance increase rate CC1 can be reduced thereby. For example, the current collapse is suppressed.

PBTI (Positive Bias Temperature Instability) will now be described. A positive voltage (e.g., +10 V or the like) is applied to the gate electrode (e.g., the third electrode 53) of a GaN power device in the on-state. At this time, PBTI occurs; for example, the threshold voltage fluctuates (e.g., decreases). An example of evaluation results of PBTI will now be described.

Figure 10:
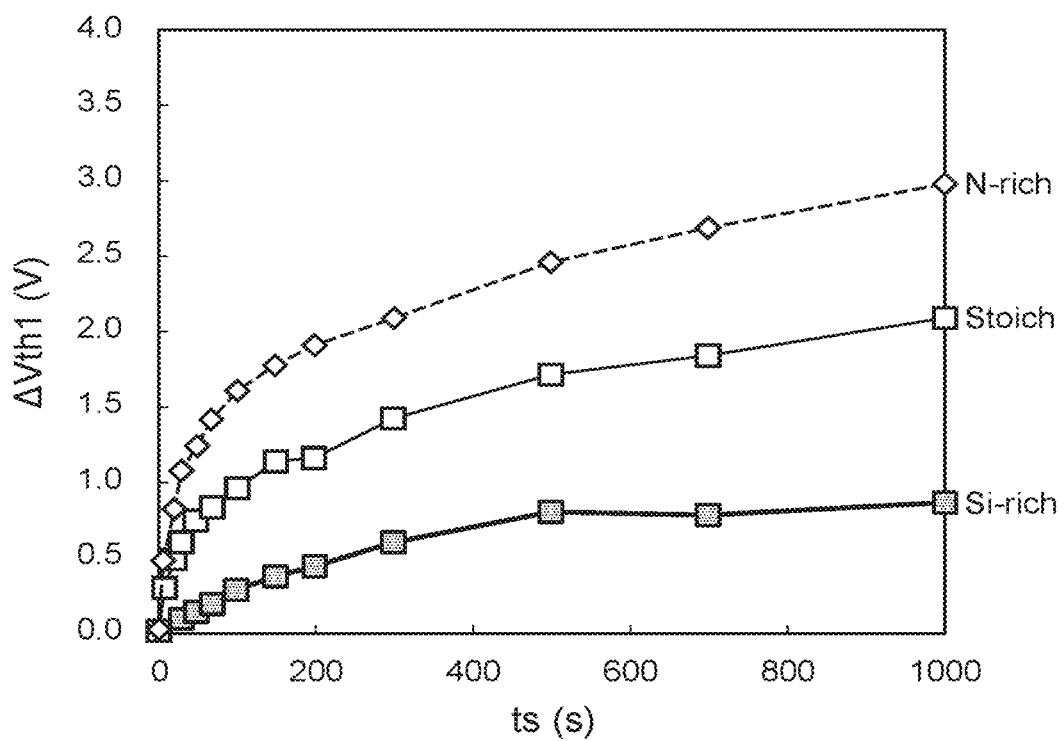
FIG. 10 is a graph illustrating a characteristic of the semiconductor device.

FIG. 10 is a graph illustrating a characteristic of the semiconductor device.

The horizontal axis of FIG. 10 is a gate stress time ts (s). The vertical axis is a threshold voltage fluctuation amount ΔVth1 (V). The threshold voltage fluctuation amount ΔVth1 is the absolute value of the difference between the threshold voltage when the gate stress time ts is 0 and the threshold voltage after the gate stress is applied. FIG. 10 illustrates the measurement result of the "Si-rich" sample, the measurement result of the "N-rich" sample, and the measurement result of the "Stoich" sample.

It can be seen from FIG. 10 that the threshold voltage fluctuation amount ΔVth1 (the absolute value) is small for the "Si-rich" sample and the "Stoich" sample. The threshold voltage fluctuation amount ΔVth1 (the absolute value) is large for the "N-rich" sample. Thus, in the case of the "N-rich" nitride layer 30, the PBTI characteristic may be low.

An example of evaluation results of the relationship between the PBTI characteristic and the composition ratio R1 (Si/N) of the nitride layer 30 will now be described.

Figure 11:
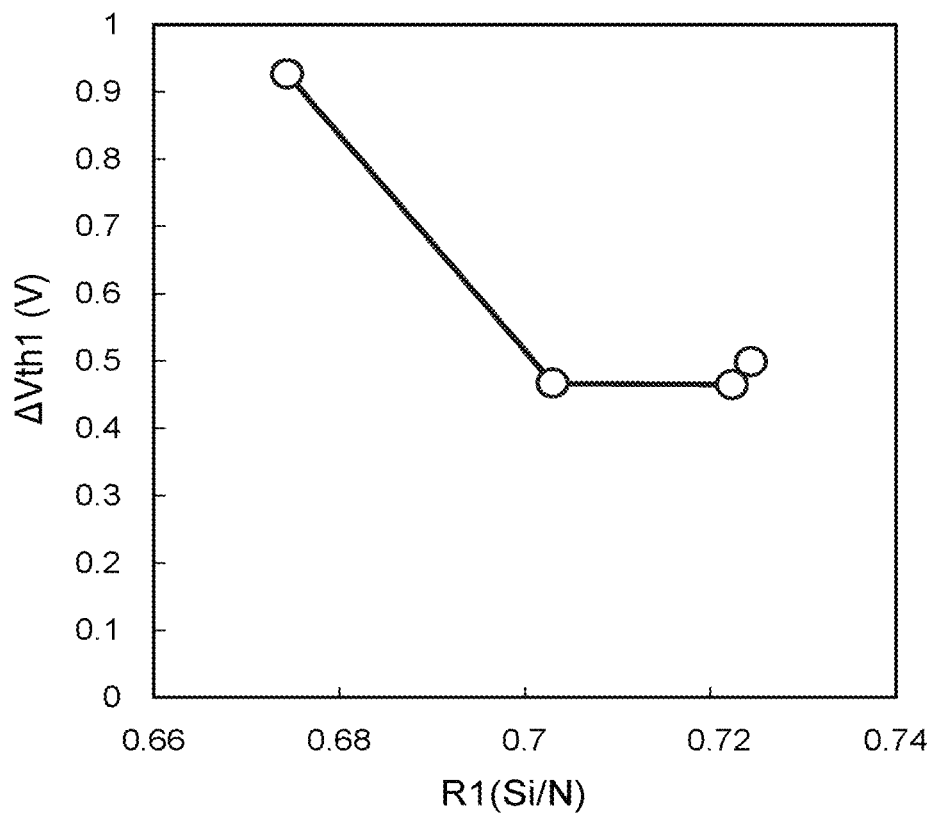
FIG. 11 is a graph illustrating a characteristic of the semiconductor device.

FIG. 11 is a graph illustrating a characteristic of the semiconductor device.

The horizontal axis of FIG. 11 is the composition ratio R1 (Si/N) of the nitride layer 30. The vertical axis is the threshold voltage fluctuation amount ΔVth1 (V). FIG. 11 shows the results when gate stress is applied at room temperature.

It can be seen from FIG. 11 that the threshold voltage fluctuation amount ΔVth1 (V) becomes large when the composition ratio R1 (Si/N) is excessively low. It is favorable for the composition ratio R1 (Si/N) to be 0.67 or more. It is more favorable for the composition ratio R1 (Si/N) to be 0.68 or more. It is more favorable for the composition ratio R1 (Si/N) to be 0.69 or more. For example, fluctuation of the threshold voltage can be suppressed.

In the embodiment, it is favorable for the composition ratio R1 (Si/N) to be, for example, not less than 0.68 and not more than 0.72. The fluctuation of the threshold voltage can be suppressed while suppressing the current collapse. In the embodiment, it is more favorable for the composition ratio R1 (Si/N) to be not less than 0.69 and not more than 0.71. The fluctuation of the threshold voltage can be suppressed further while further suppressing the current collapse (the resistance increase rate CC1).

An example of a characteristic when changing the thickness of the nitride layer 30 will now be described. The samples described below have the configuration illustrated in FIG. 1. The composition ratio R1 (Si/N) of the nitride layer 30 is 0.69.

Figure 12:
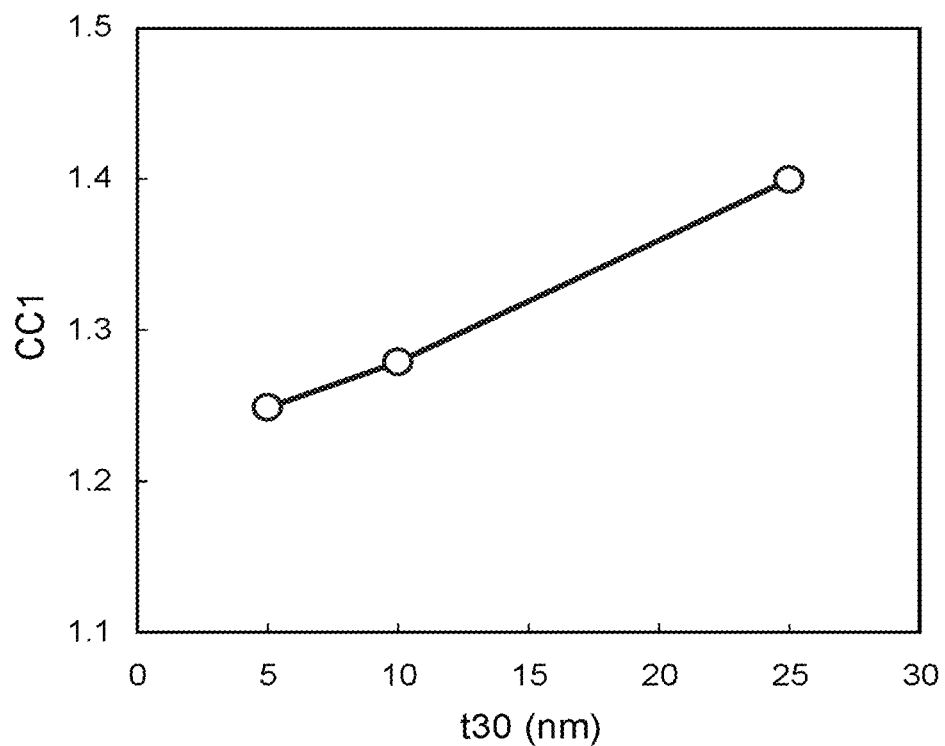
FIG. 12 is a graph illustrating a characteristic of the semiconductor device.

FIG. 12 is a graph illustrating a characteristic of the semiconductor device.

The horizontal axis of FIG. 12 is a thickness t30 (nm) of the nitride layer 30. For example, the thickness t30 corresponds to the first thickness t31 (referring to FIG. 1). The thickness t30 is substantially the same as the second thickness t32 (referring to FIG. 1). The vertical axis of FIG. 12 is the resistance increase rate CC1 when applying the drain voltage stress. As shown in FIG. 12, the resistance increase rate CC1 increases as the thickness t30 increases.

In the embodiment, it is favorable for the thickness t30 to be 10 nm or less. The thickness t30 may be 5 nm or less. For example, the resistance increase rate CC1 can be suppressed.

In the embodiment, it is favorable for the first thickness t31 along the second direction (e.g., the Z-axis direction) of the first nitride region 31 to be, for example, 10 nm or less. The first thickness t31 may be 5 nm or less. It is favorable for the first thickness t31 to be 0.2 nm or more. For example, a uniform layer is obtained easily by setting the first thickness t31 to be 0.2 nm or more. For example, the oxidization of the AlGaN layer (the second semiconductor layer 20) provided under the nitride layer 30 is suppressed easily.

Figure 13:
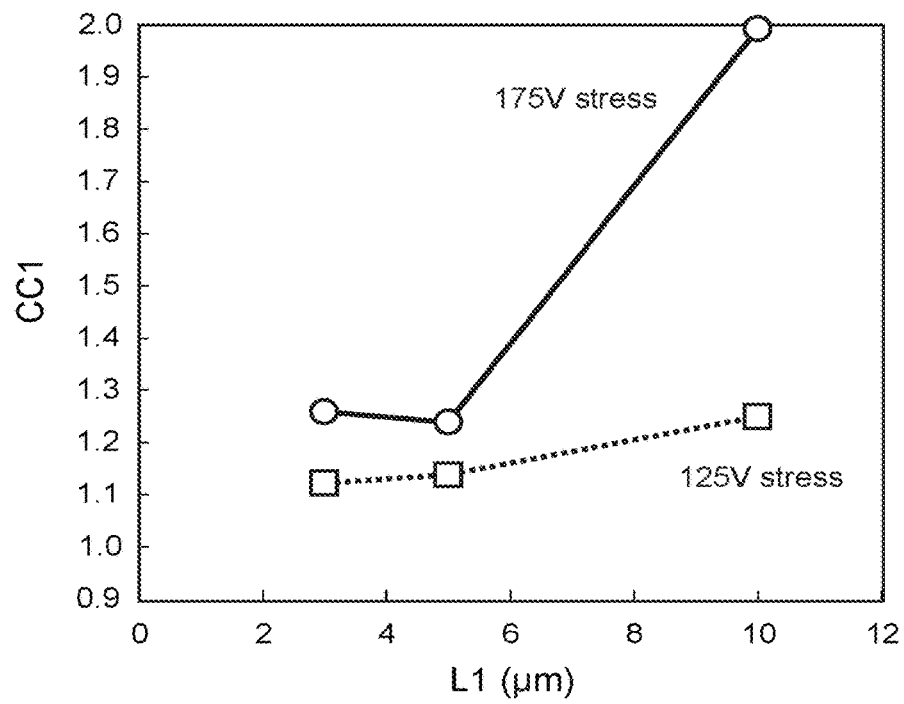
FIG. 13 is a graph illustrating a characteristic of the semiconductor device.

FIG. 13 is a graph illustrating a characteristic of the semiconductor device.

The horizontal axis of FIG. 13 is the length L1 (μm) along the first direction (the X-axis direction) of the first electrode region 53a. For example, the length L1 corresponds to the overlap length. In the example, the length LD along the first direction between the first electrode region 53a and the first electrode 51 (referring to FIG. 1) is 14 μm. The vertical axis of FIG. 13 is the resistance increase rate CC1 when the drain voltage stress is applied. FIG. 13 shows the characteristic when the drain voltage VD which is the stress is 125 V and the characteristic when the drain voltage VD is 175 V.

It can be seen from FIG. 13 that a low resistance increase rate CC1 is obtained when the length L1 is short. The decrease is pronounced when the drain voltage VD which is the stress is high.

In the embodiment, it is favorable for the length L1 to be 5 μm or less. It is favorable for the ratio of the length L1 to the length LD to be, for example, 0.35 or less. A low resistance increase rate CC1 is obtained.

Figure 14:
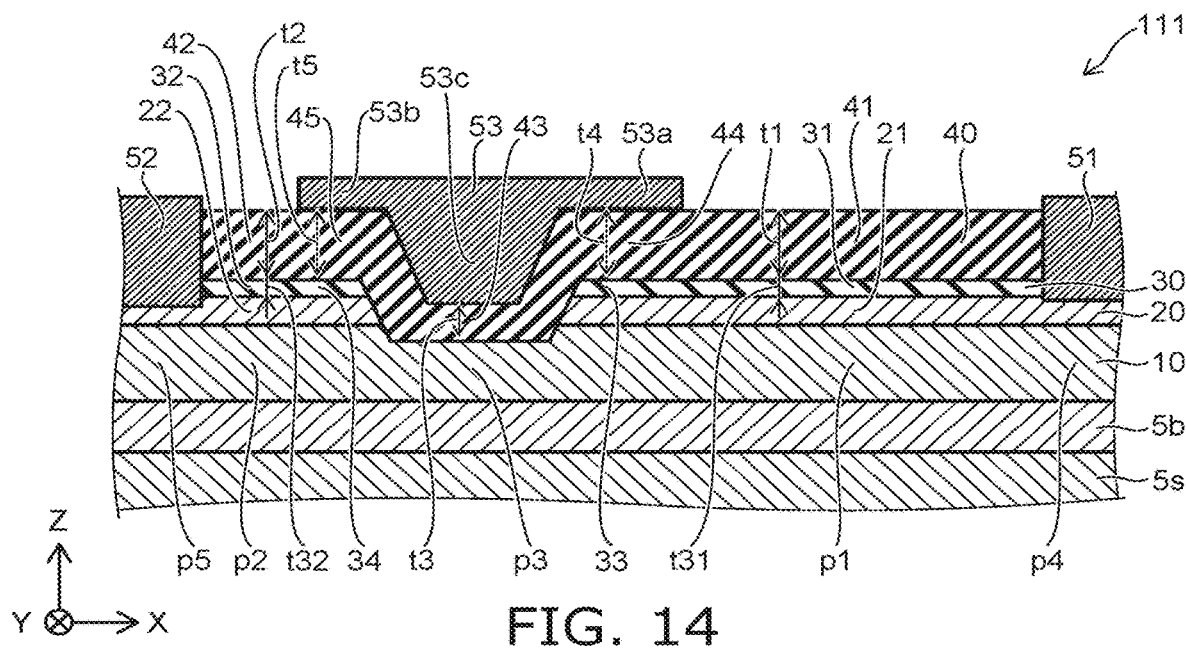
FIG. 14 is a schematic cross-sectional view illustrating a semiconductor device according to the first embodiment.

FIG. 14 is a schematic cross-sectional view illustrating a semiconductor device according to the first embodiment.

As shown in FIG. 14, the semiconductor device 111 according to the embodiment also includes the first to third electrodes 51 to 53, the first semiconductor layer 10, the second semiconductor layer 20, the nitride layer 30, and the oxide layer 40. In the semiconductor device 111, the position of the lower end of the third electrode 53 is lower than that of the semiconductor device 110. Otherwise, the configuration of the semiconductor device 111 is similar to the configuration of the semiconductor device 110. An example of the third electrode 53 of the semiconductor device 111 will now be described.

As shown in FIG. 14, a portion of the third electrode region 53c is between at least a portion of the first semiconductor region 21 and at least a portion of the second semiconductor region 22 in the first direction (the X-axis direction). For example, the lower end of the third electrode region 53c may be positioned lower than the upper end of the second semiconductor layer 20. For example, the target threshold voltage is obtained easily. For example, a normally-off element is obtained easily.

Figure 15:
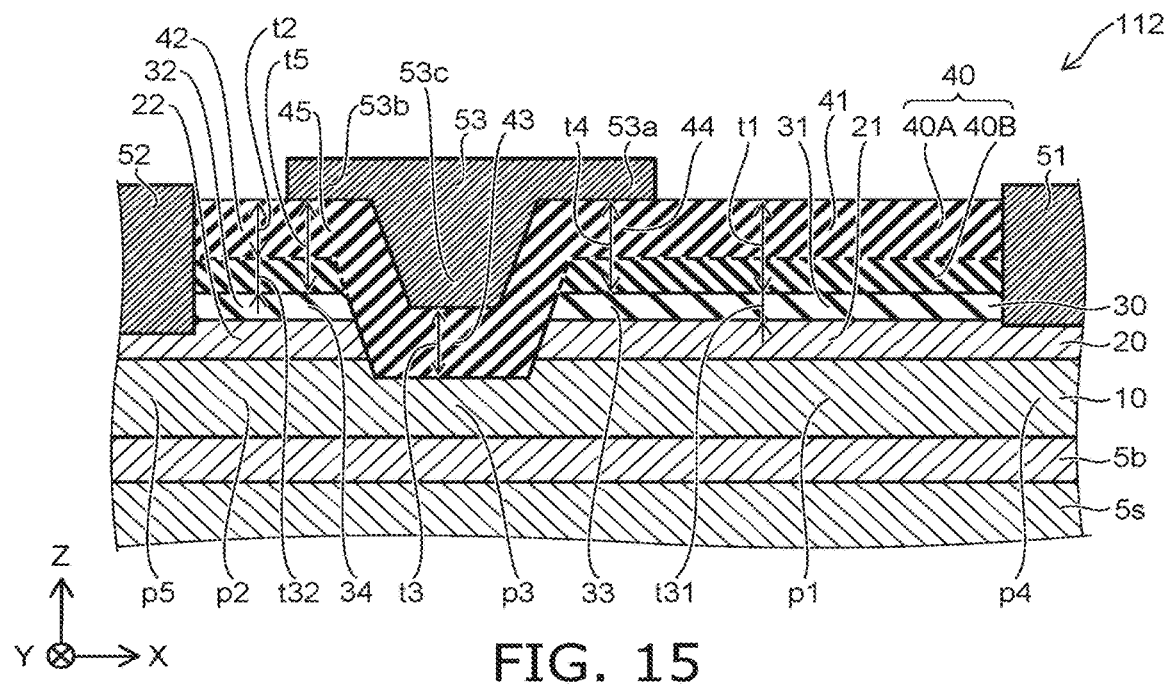
FIG. 15 is a schematic cross-sectional view illustrating a semiconductor device according to the first embodiment.

FIG. 15 is a schematic cross-sectional view illustrating a semiconductor device according to the first embodiment.

As shown in FIG. 15, the semiconductor device 112 according to the embodiment also includes the first to third electrodes 51 to 53, the first semiconductor layer 10, the second semiconductor layer 20, the nitride layer 30, and the oxide layer 40. In the semiconductor device 112, the oxide layer 40 includes a first oxide film 40A and a second oxide film 40B. Otherwise, the configuration of the semiconductor device 112 is similar to the configuration of the semiconductor device 110. An example of the oxide layer 40 of the semiconductor device 112 will now be described.

As shown in FIG. 15, the oxide layer 40 includes the first oxide film 40A and the second oxide film 40B. The second oxide film 40B is provided between the first oxide film 40A and the nitride layer 30. The first oxide film 40A and the second oxide film 40B each are, for example, silicon oxide films. The boundary between the first oxide film 40A and the second oxide film 40B may not be distinct.

For example, the second oxide film 40B is formed on the nitride layer 30. For example, the first oxide film 40A is formed on the third partial region p3 and the second oxide film 40B.

The first oxide film 40A and the second oxide film 40B are used as the first oxide region 41 above the first nitride region 31. The first oxide film 40A and the second oxide film 40B are used as the second oxide region 42 above the second nitride region 32. In the example, the second oxide film 40B is not provided between the third partial region p3 and the third electrode.

The thickness of the second oxide film 40B is, for example, not less than 30 nm and not more than 100 nm.

In such a configuration, the thickness of the oxide layer 40 is different by location. The thickness t3 along the second direction (e.g., the Z-axis direction) of the third oxide region 43 is thinner than the thickness t4 along the second direction of the fourth oxide region 44. The absolute value of the difference between the thickness t3 and the thickness t4 is, for example, not less than 30 nm and not more than 100 nm. The thickness t3 of the third oxide region 43 may be thinner than the thickness t1 along the second direction of the first oxide region 41. The absolute value of the difference between the thickness t3 and the thickness t1 is, for example, not less than 30 nm and not more than 100 nm. The thickness t3 of the third oxide region 43 may be thinner than the thickness t5 along the second direction of the fifth oxide region 45. The absolute value of the difference between the thickness t3 and the thickness t5 is, for example, not less than 30 nm and not more than 100 nm. The thickness t3 of the third oxide region 43 may be thinner than the thickness t2 along the second direction of the second oxide region 42. The absolute value of the difference between the thickness t3 and the thickness t2 is, for example, not less than 30 nm and not more than 100 nm.

In the semiconductor device 112, the thickness t4 of the fourth oxide region 44 (the oxide layer 40 at the portion corresponding to the first electrode region 53a) is thicker than the thickness t3 of the third oxide region 43 (the portion corresponding to the third electrode region 53c). The electric field in the fourth oxide region 44 is suppressed thereby. Thereby, the degradation of the characteristics of the fourth oxide region 44, etc., can be suppressed. For example, the characteristic fluctuation due to PBTI, etc., can be suppressed.

Figure 16:
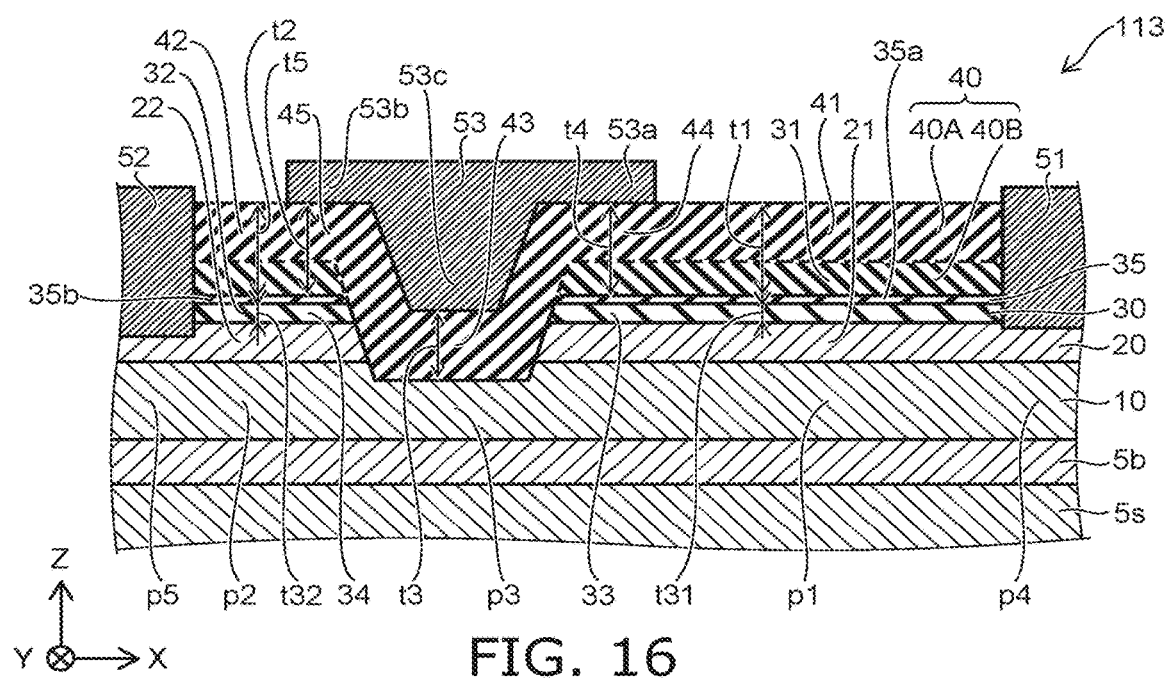
FIG. 16 is a schematic cross-sectional view illustrating a semiconductor device according to the first embodiment.

FIG. 16 is a schematic cross-sectional view illustrating a semiconductor device according to the first embodiment.

As shown in FIG. 16, the semiconductor device 113 according to the embodiment also includes the first to third electrodes 51 to 53, the first semiconductor layer 10, the second semiconductor layer 20, the nitride layer 30, and the oxide layer 40. A first intermediate region 35a and a second intermediate region 35b are further provided in the semiconductor device 113. Otherwise, the configuration of the semiconductor device 113 is similar to the configuration of the semiconductor device 112. An example of the first intermediate region 35a and the second intermediate region 35b of the semiconductor device 113 will now be described.

As shown in FIG. 16, the first intermediate region 35a is provided between the first nitride region 31 and the first oxide region 41. The second intermediate region 35b is provided between the second nitride region 32 and the second oxide region 42. In an example, the first intermediate region 35a includes silicon, oxygen, and nitrogen. The second intermediate region 35b includes silicon, oxygen, and nitrogen. The first intermediate region 35a and the second intermediate region 35b (the intermediate region 35) are, for example, a SiON region. In another example, the first intermediate region 35a includes aluminum and nitrogen. The second intermediate region 35b includes aluminum and nitrogen. The first intermediate region 35a and the second intermediate region 35b (the intermediate region 35) are, for example, an AlN region. Thus, the first intermediate region may include one of a first material or a second material. The first material includes silicon, oxygen, and nitrogen. The second material includes aluminum and nitrogen. The second intermediate region includes the one of the first material or the second material. Such an intermediate region 35 may be provided between the nitride layer 30 and the oxide layer 40.

Figure 17:
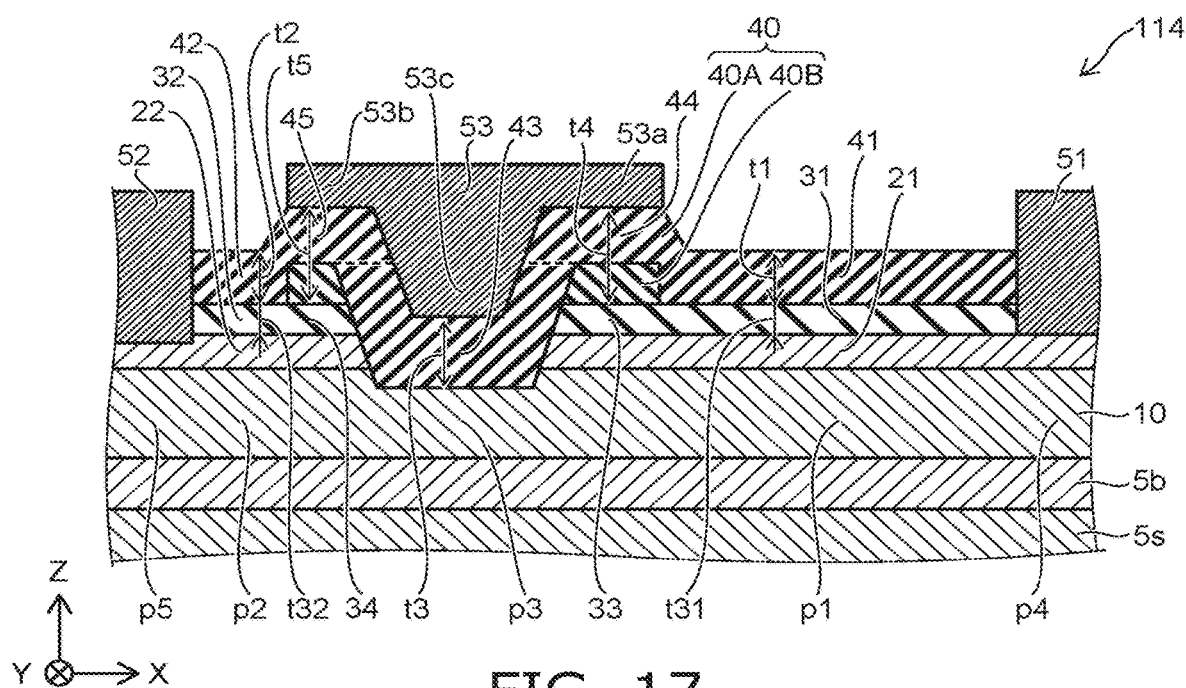
FIG. 17 is a schematic cross-sectional view illustrating a semiconductor device according to the first embodiment.

FIG. 17 is a schematic cross-sectional view illustrating a semiconductor device according to the first embodiment.

As shown in FIG. 17, the semiconductor device 114 according to the embodiment also includes the first to third electrodes 51 to 53, the first semiconductor layer 10, the second semiconductor layer 20, the nitride layer 30, and the oxide layer 40. In the semiconductor device 114, the second oxide film 40B is provided at a portion of the nitride layer 30. Otherwise, the configuration of the semiconductor device 114 is similar to the configuration of the semiconductor device 112. An example of the second oxide film 40B of the semiconductor device 114 will now be described.

A portion of the second oxide film 40B is provided between the first electrode region 53a and the first nitride region 31 in the second direction (e.g., the Z-axis direction). Another portion of the second oxide film 40B is provided between the second electrode region 53b and the second nitride region 32 in the second direction (e.g., the Z-axis direction).

Thereby, for example, the thickness t4 along the second direction (e.g., the Z-axis direction) of the fourth oxide region 44 is locally thick. For example, the thickness t5 along the second direction (e.g., the Z-axis direction) of the fifth oxide region 45 is locally thick.

For example, the thickness t4 is thicker than the thickness t1 along the second direction (e.g., the Z-axis direction) of the first oxide region 41. The thickness t5 is thicker than the thickness t2 along the second direction of the second oxide region 42.

In the semiconductor device 114, the thickness t4 of the fourth oxide region 44 is thicker than the thickness t3 of the third oxide region 43. The electric field in the fourth oxide region 44 is suppressed thereby. Thereby, the degradation of the characteristics of the fourth oxide region 44, etc., can be suppressed. For example, the characteristic fluctuation due to PBTI, etc., can be suppressed. The thickness t5 is thicker than the thickness t3 of the third oxide region 43. The electric field in the fifth oxide region 45 is suppressed thereby. Thereby, the degradation of the characteristics of the fifth oxide region 45, etc., can be suppressed. For example, the characteristic fluctuation due to PBTI, etc., can be suppressed.

For example, the difference between the thickness t4 and the thickness t1 is not less than 30 nm and not more than 100 nm. For example, the difference between the thickness t5 and the thickness t2 is not less than 30 nm and not more than 100 nm.

Figure 18:
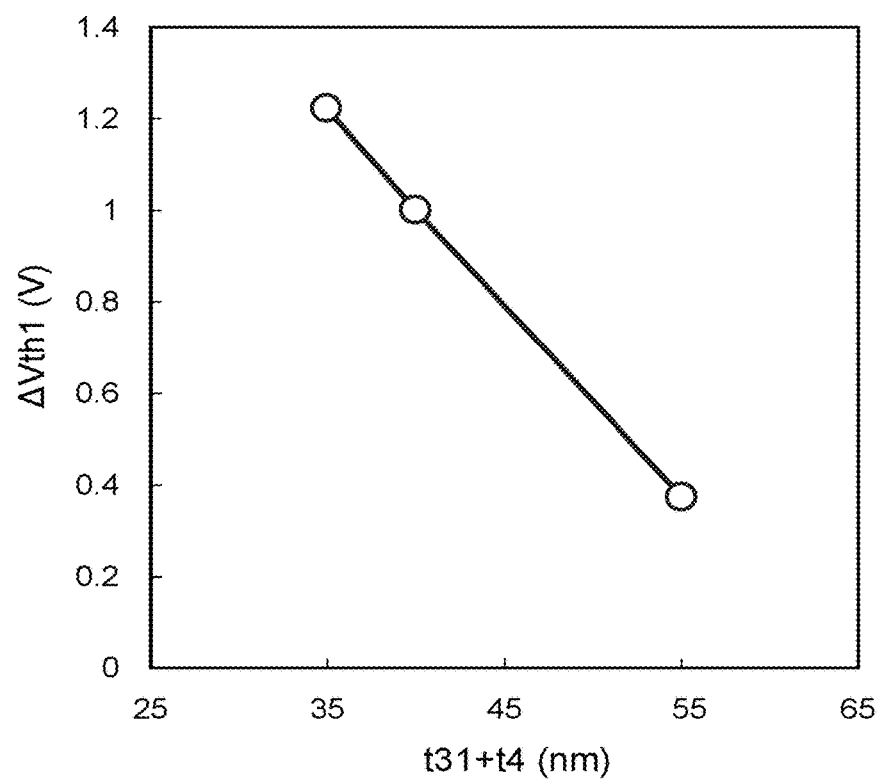
FIG. 18 is a graph illustrating a characteristic of the semiconductor device.

FIG. 18 is a graph illustrating a characteristic of the semiconductor device.

FIG. 18 illustrates the PBTI characteristic of the semiconductor device. The horizontal axis of FIG. 18 is the total thickness of the first thickness t31 (nm) and the thickness t4 (nm) of the fourth oxide region 44. The vertical axis of FIG. 18 is the threshold voltage fluctuation amount ΔVth1 (V). FIG. 18 shows the results when gate stress is applied at room temperature.

It can be seen from FIG. 18 that the threshold voltage fluctuation amount ΔVth1 decreases when the total thickness is large. It is considered that this is because the electric field in the fourth oxide region 44 is suppressed. The characteristic fluctuation due to PBTI can be suppressed by increasing the thickness t4 of the fourth oxide region 44. For example, it is favorable for the thickness t4 to be 30 nm or more.

If the difference between the thickness t3 and the thickness t4 is too large, for example, the coverage degrades; and element breakdown occurs easily. It is desirable for the absolute value of the difference between the thickness t3 and the thickness t4 to be, for example, 100 nm or less. Good coverage is obtained easily. For example, the element breakdown is suppressed.

In the embodiment recited above, the concentration BC (Si—H) of the bond of Si and hydrogen of the nitride layer 30 (referring to FIG. 4) is, for example, $6 \times 10^{21}$ cm$^{-3}$ or less. The dangling bond concentration C1 of Si of the nitride layer 30 (referring to FIG. 3) is, for example, $4 \times 10^{18}$ cm$^{-3}$ or less.

In the embodiment, it is favorable for the concentration of hydrogen in the third oxide region 43 to be low. The concentration of hydrogen in the third oxide region 43 is, for example, $2 \times 10^{19}$ cm$^{-3}$ or less. Thereby, the characteristics are more stable. For example, the characteristic fluctuation of the element due to PBTI does not occur easily.

For example, it is considered that the characteristics necessary for the insulating film of a normally-off device are different from the characteristics necessary for the insulating film of a normally-on device. For example, the characteristics that are necessary for the insulating film to reduce the current collapse recited above are unique to normally-off. By using the "N-rich" nitride layer 30, the fluctuation of the characteristics of a normally-off device can be suppressed effectively.

Second Embodiment

A second embodiment relates to a method for manufacturing a semiconductor device.

FIG. 19A to FIG. 19D are schematic cross-sectional views in order of the processes, illustrating the method for manufacturing the semiconductor device according to the second embodiment.

Figure 19A:
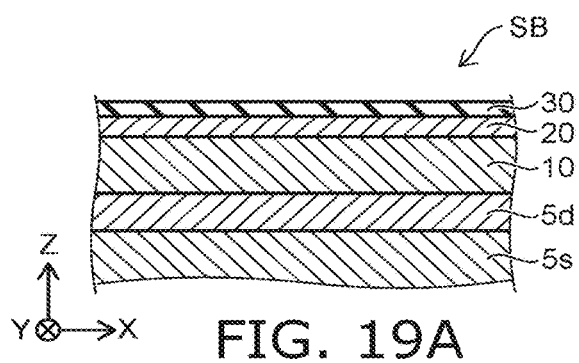
FIG. 19A to FIG. 19D are schematic cross-sectional views in order of the processes, illustrating a method for manufacturing a semiconductor device according to the second embodiment.

A stacked body SB is prepared as shown in FIG. 19A. The stacked body SB includes the first semiconductor layer 10 including $Al_{x1}Ga_{1-x1}N$ (0≤x1≤1), the second semiconductor layer 20 including $Al_{x2}Ga_{1-x2}N$ (0<x2≤1), and the nitride layer 30 including silicon and nitrogen. The second semiconductor layer 20 is provided between the first semiconductor layer 10 and the nitride layer 30. The ratio Si/N of the concentration of silicon (Si) in the nitride layer 30 to the concentration of nitrogen (N) in the nitride layer 30 is not less than 0.68 and not more than 0.72. For example, the nitride layer 30 contacts the second semiconductor layer 20. In the example, the buffer layer 5b is provided on the substrate 5s; and the stacked body SB is provided on the buffer layer 5b.

For example, the nitride layer 30 is formed by a technique such as CVD, etc. The ratio Si/N in the nitride layer 30 is controlled by controlling the flow rate of the source gas (e.g., ammonia), etc.

In the manufacturing method according to the embodiment, heat treatment of the stacked body SB is performed after forming the nitride layer 30. For example, the heat treatment is performed in a nitrogen atmosphere for 5 minutes or more at 700° C. or more.

Figure 19B:
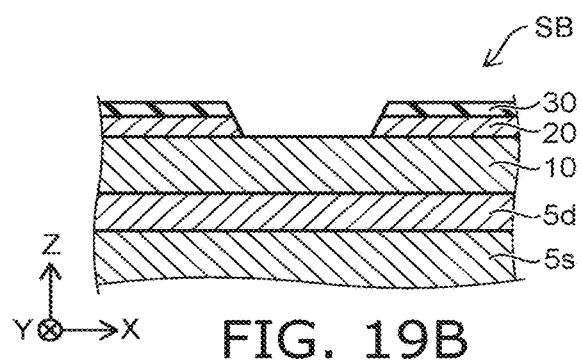

For example, as shown in FIG. 19B, a portion of the nitride layer 30 and a portion of the second semiconductor layer 20 after the heat treatment may be removed.

Figure 19C:
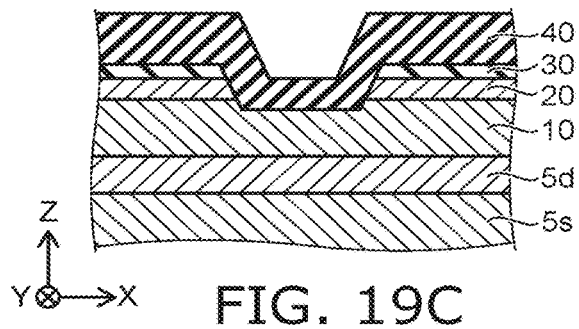

For example, as shown in FIG. 19C, the oxide layer 40 that includes silicon and oxygen is formed at the remaining portion of the nitride layer 30 and the remaining portion of the second semiconductor layer 20. The concentration of nitrogen in the oxide layer 40 is lower than the concentration of nitrogen in the nitride layer 30.

Figure 19D:
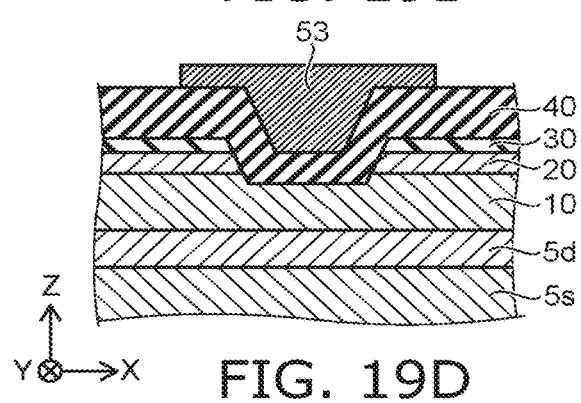

For example, an electrode (e.g., the third electrode 53) is formed as shown in FIG. 19D. At least a portion of the oxide layer 40 recited above is provided between the electrode (the third electrode 53) and the remaining portion of the second semiconductor layer 20 recited above. Other electrodes are formed as appropriate. Thereby, for example, the semiconductor device 110 is obtained. According to the manufacturing method according to the embodiment, a method for manufacturing a semiconductor device having stable characteristics can be provided.

According to the embodiments, a semiconductor device and a method for manufacturing the semiconductor device having stable characteristics can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as electrodes, semiconductor layers, nitride layers, oxide layers, substrates, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included. Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode, a direction from the second electrode toward the first electrode being aligned with a first direction;

a third electrode, a position in the first direction of the third electrode being between a position in the first direction of the first electrode and a position in the first direction of the second electrode;

a first semiconductor layer including $Al_{x1}Ga_{1-x1}N$ ($0 \le x1 \le 1$), the first semiconductor layer including first to fifth partial regions, a direction from the fourth partial region toward the first electrode, a direction from the fifth partial region toward the second electrode, and a direction from the third partial region toward the third electrode being aligned with a second direction crossing the first direction, the first partial region being between the fourth partial region and the third partial region in the first direction, the second partial region being between the third partial region and the fifth partial region in the first direction;

a nitride layer including silicon and nitrogen, a ratio Si/N of a concentration of silicon (Si) in the nitride layer to a concentration of nitrogen (N) in the nitride layer being not less than 0.68 and not more than 0.72, the nitride layer including a first nitride region and a second nitride region;

a second semiconductor layer including $Al_{x2}Ga_{1-x2}N$ ($0 < x2 \le 1$), the second semiconductor layer including a first semiconductor region and a second semiconductor region, the first semiconductor region being provided between the first partial region and the first nitride region in the second direction and contacting the first nitride region, the second semiconductor region being provided between the second partial region and the second nitride region in the second direction and contacting the second nitride region;

an oxide layer including silicon and oxygen, a concentration of nitrogen in the oxide layer being lower than a concentration of nitrogen in the nitride layer, the oxide layer including first to third oxide regions, at least a portion of the first nitride region being provided between the first oxide region and the first semiconductor region, at least a portion of the second nitride region being provided between the second oxide region and the second semiconductor region, the third oxide region being provided between the third partial region and the third electrode and directly contacting the third partial region and the third electrode.

2. The device according to claim 1, wherein a first thickness along the second direction of the first nitride region is 10 nm or less.

3. The device according to claim 2, wherein the first thickness is 0.2 nm or more.

4. The device according to claim 1, wherein the ratio Si/N is not less than 0.69 and not more than 0.71.

5. The device according to claim 1, wherein
at least a portion of the first nitride region contacts the first oxide region, and
at least a portion of the second nitride region contacts the second oxide region.

6. The device according to claim 1, further comprising:
a first intermediate region provided between the first nitride region and the first oxide region,
the first intermediate region including one of a first material or a second material, the first material including silicon, oxygen, and nitrogen, the second material including aluminum and nitrogen.

7. The device according to claim 1, wherein at least a portion of the third oxide region is between the first semiconductor region and the second semiconductor region in the first direction.

8. The device according to claim 1, wherein a portion of the third oxide region is between the first partial region and the second partial region in the first direction.

9. The device according to claim 1, wherein
a portion of the third oxide region is between at least a portion of the first semiconductor region and at least a portion of the second semiconductor region in the first direction.

10. The device according to claim 1, wherein
the third electrode includes first to third electrode regions,
a position in the first direction of the third electrode region is between a position in the first direction of the first electrode region and a position in the first direction of the second electrode region,
the oxide layer further includes a fourth oxide region and a fifth oxide region,
the nitride layer further includes a third nitride region and a fourth nitride region,
the fourth oxide region is between the third nitride region and the first electrode region in the second direction,
the fifth oxide region is between the fourth nitride region and the second electrode region in the second direction, and
the third oxide region is provided between the third partial region and the third electrode region and contacts the third partial region and the third electrode region.

11. The device according to claim 10, wherein a thickness along the second direction of the third oxide region is thinner than a thickness along the second direction of the fourth oxide region and thinner than a thickness along the second direction of the fifth oxide region.

12. The device according to claim 11, wherein an absolute value of a difference between the thickness along the second direction of the third oxide region and the thickness along the second direction of the fourth oxide region is not less than 30 nm and not more than 100 nm.

13. The device according to claim 11, wherein
the thickness along the second direction of the fourth oxide region is thicker than a thickness along the second direction of the first oxide region, and
the thickness along the second direction of the fifth oxide region is thicker than a thickness along the second direction of the second oxide region.

14. The device according to claim 10, wherein a length along the first direction of the first electrode region is 5 μm or less.

15. The device according to claim 10, wherein a length along the first direction of the first electrode region is not less than 0.035 times and not more than 0.35 times a length along the first direction between the first electrode region and the first electrode.

16. The device according to claim 1, wherein a concentration of a bond of silicon and hydrogen in the nitride layer is $6 \times 10^{21}$ cm$^{-3}$ or less.

17. The device according to claim 1, wherein a concentration of hydrogen in the third oxide region is $2 \times 10^{19}$ cm$^{-3}$ or less.

18. The device according to claim 1, wherein
the first electrode is a drain electrode,
the second electrode is a source electrode, and
the third electrode is a gate electrode.

19. A method for manufacturing a semiconductor device, comprising:
performing heat treatment of a stacked body, the stacked body including a first semiconductor layer, a second semiconductor layer, and a nitride layer, the first semiconductor layer including $Al_{x1}Ga_{1-x1}N$ ($0 \le x1 \le 1$), the second semiconductor layer including $Al_{x2}Ga_{1-x2}N$ ($0<x2\leq1$), the nitride layer including silicon and nitrogen, the second semiconductor layer being provided between the first semiconductor layer and the nitride layer, a ratio Si/N of a concentration of silicon (Si) in the nitride layer to a concentration of nitrogen (N) in the nitride layer being not less than 0.68 and not more than 0.72;

removing a portion of the nitride layer and a portion of the second semiconductor layer after the heat treatment;

forming an oxide layer at a remaining portion of the nitride layer and a remaining portion of the second semiconductor layer, the oxide layer including silicon and oxygen, a concentration of nitrogen in the oxide layer being lower than a concentration of nitrogen in the nitride layer; and forming an electrode, the oxide layer being provided between the electrode and the remaining portion of the second semiconductor layer.

* * * * *